(12) United States Patent
Weiss et al.

(10) Patent No.: US 11,495,551 B2
(45) Date of Patent: Nov. 8, 2022

(54) POWER SEMICONDUCTOR MODULE WITH INTEGRATED SURGE ARRESTER

(71) Applicant: Hitachi Energy Switzerland AG, Baden (CH)

(72) Inventors: David Weiss, Turgi (CH); Mathias Duerr, Zürich (CH); Stefan Fuchs, Berikon (CH)

(73) Assignee: Hitachi Energy Switzerland AG, Baden (CH)

( * ) Notice: Subject to any disclaimer, the term of this patent is extended or adjusted under 35 U.S.C. 154(b) by 0 days.

(21) Appl. No.: 17/625,457

(22) PCT Filed: Jul. 9, 2020

(86) PCT No.: PCT/EP2020/069424
§ 371 (c)(1),
(2) Date: Jan. 7, 2022

(87) PCT Pub. No.: WO2021/005171
PCT Pub. Date: Jan. 14, 2021

(65) Prior Publication Data
US 2022/0208700 A1 Jun. 30, 2022

(30) Foreign Application Priority Data
Jul. 9, 2019 (EP) .................................. 19185196

(51) Int. Cl.
*H01L 23/62* (2006.01)
*H01L 25/11* (2006.01)
(Continued)

(52) U.S. Cl.
CPC ............. *H01L 23/62* (2013.01); *H01L 25/115* (2013.01); *H01L 23/467* (2013.01); *H01L 23/473* (2013.01)

(58) Field of Classification Search
CPC .............................. H01L 23/62; H01L 25/115
See application file for complete search history.

(56) References Cited

U.S. PATENT DOCUMENTS

| 5,371,651 A | 12/1994 | Asplund et al. |
| 6,353,236 B1 | 3/2002 | Yatsuo et al. |

(Continued)

FOREIGN PATENT DOCUMENTS

| EP | 0987722 A2 | 3/2000 |
| JP | H06507301 A | 8/1994 |

(Continued)

*Primary Examiner* — Allan R Wilson
(74) *Attorney, Agent, or Firm* — Slater Matsil, LLP

(57) ABSTRACT

A power semiconductor module includes a plurality of power semiconductor chips. A housing accommodates the power semiconductor chips. A first module electrode on a first side of the housing electrically is connected to a first chip electrode of the power semiconductor chips. A second module electrode on a second side of the housing electrically is connected to a second chip electrode. A surge arrester arrangement with a surge arrester is accommodated in the housing such that a first electrode of the surge arrester arrangement is provided at the first side of the housing and a second electrode of the surge arrester arrangement is provided at the second side of the housing. The power semiconductor chips are arranged in an annular region in the housing and the surge arrester arrangement is arranged within the annular region.

20 Claims, 2 Drawing Sheets

(51) Int. Cl.
*H01L 23/467* (2006.01)
*H01L 23/473* (2006.01)

(56) References Cited

U.S. PATENT DOCUMENTS

| | | |
|---|---|---|
| 6,738,258 B2 | 5/2004 | Bijlenga et al. |
| 2003/0107875 A1* | 6/2003 | Bijlenga ................ H01L 24/72 |
| | | 257/E25.026 |
| 2010/0328975 A1 | 12/2010 | Hibino et al. |
| 2017/0011875 A1 | 1/2017 | Dorn et al. |
| 2019/0052189 A1* | 2/2019 | Oomori ................ H02M 7/48 |
| 2019/0287948 A1* | 9/2019 | Oomori ................ H01L 25/07 |
| 2019/0305205 A1 | 10/2019 | Feichtinger |
| 2019/0355634 A1* | 11/2019 | Liu ...................... H01L 25/072 |
| 2019/0371773 A1 | 12/2019 | Oomori |

FOREIGN PATENT DOCUMENTS

| | | |
|---|---|---|
| JP | 2000091596 A | 3/2000 |
| JP | 2019536282 A | 12/2019 |
| WO | 2018096734 A1 | 5/2018 |

* cited by examiner

POWER SEMICONDUCTOR MODULE WITH INTEGRATED SURGE ARRESTER

CROSS-REFERENCE TO RELATED APPLICATIONS

This application is a national stage application of International Application No. PCT/EP2020/069424, filed on Jul. 9, 2020, which claims priority to European Patent Application No. 19185196.3, filed on Jul. 9, 2019, which applications are hereby incorporated herein by reference.

TECHNICAL FIELD

The invention relates to a power semiconductor module and to a stack of such modules.

BACKGROUND

Medium voltage DC-breakers being composed of IGCTs and/or IGBTs combined with a surge arrester for voltage limitation and energy dissipation are recent trends in medium voltage DC applications. The performance of the combination of the power semiconductors and the surge arrester is usually strongly influenced by their electrical interconnection. In particular, the stray inductance in the conductor loop formed of the surge arrester and the power semiconductors may cause an overshoot voltage which should be as small as possible.

U.S. Pat. No. 6,738,258 B2 relates to a power semiconductor module with submodules that are series-connect via a connection element. The connection element is arranged between the submodules.

EP 0 987 722 A2 relate to a surge absorber and power modules with such a surge absorber. The surge absorber is connected in parallel to a semiconductor switch.

US 2017/011 875 A1 relates to a DC switching device with surge absorbers, which are connected in parallel to a semiconductor switch.

WO 2018/096 734 A1 shows a semiconductor module with thyristors and surge absorbing devices. The thyristors are connected in series and the surge absorbing devices are connected in parallel to the series-connection.

SUMMARY

Embodiments of the invention provide a compact power semiconductor module with an integrated surge arrester having a low stray inductance.

In one embodiment, a power semiconductor module includes a plurality of power semiconductor chips. A housing accommodates the power semiconductor chips. A first module electrode on a first side of the housing electrically is connected to a first chip electrode of the power semiconductor chips. A second module electrode on a second side of the housing electrically is connected to a second chip electrode. A surge arrester arrangement with a surge arrester is accommodated in the housing such that a first electrode of the surge arrester arrangement is provided at the first side of the housing and a second electrode of the surge arrester arrangement is provided at the second side of the housing. The power semiconductor chips are arranged in an annular region in the housing and the surge arrester arrangement is arranged within the annular region.

Other aspects and embodiments are disclosed below.

These and other aspects of the invention will be apparent from and elucidated with reference to the embodiments described hereinafter.

BRIEF DESCRIPTION OF THE DRAWINGS

The subject-matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF ILLUSTRATIVE EMBODIMENTS

Figure 1:
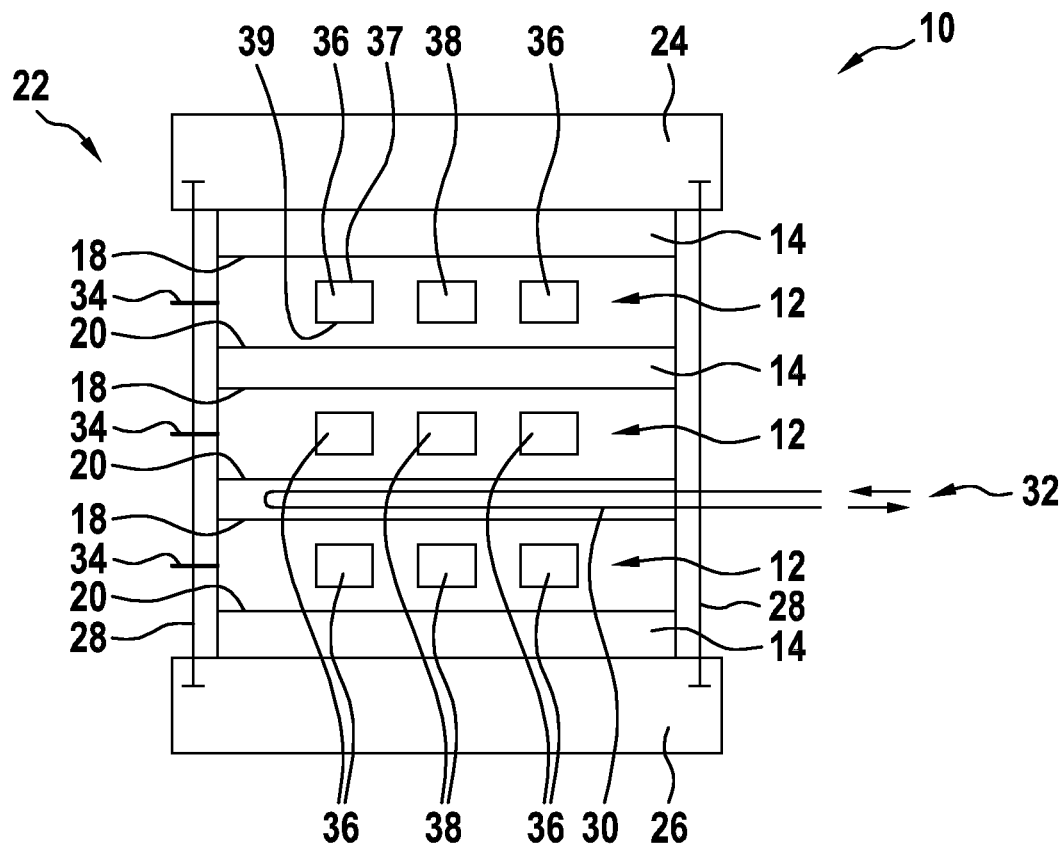
FIG. 1 schematically shows a stack of power semiconductor modules according to an embodiment of the invention.

An aspect of the invention relates to a power semiconductor module. A power semiconductor module may be a device, which mechanically and electrically interconnects power semiconductor chips with electrical conductors and terminals, such that the power semiconductor module can be used as a building block for larger machines, such as rectifiers, inverters, electrical drives, etc. In particular, the power semiconductor module may be used in a power semiconductor stack, which series-connects a plurality of these modules. Such stacks may be used as switches in medium and high voltage applications, such as a DC breaker.

The term "power" in power semiconductor module and/or power semiconductor chip may relate to the ability to process currents of more than 10 A and/or more than 100 V.

According to an embodiment of the invention, the power semiconductor module comprises a plurality of power semiconductor chips, each of which provides at least one power semiconductor switch and a housing for accommodating the power semiconductor chips. The power semiconductor switches may be IGCTs and/or IGBTs. The housing may be made of plastics. It may be that the switches are directly connected to the housing. However, it also is possible that the chips are accommodated in submodules, which themselves are accommodated in the housing of the module.

According to an embodiment of the invention, the power semiconductor module further comprises at least one first module electrode on a first side of the housing electrically connected to a first chip electrode of the power semiconductor chips and at least one second module electrode on a second side of the housing electrically connected to a second chip electrode of the power semiconductor chips, which second side of the housing is opposite to the first side.

The power semiconductor chips and/or the power semiconductor switches may be connected in parallel between the at least one first module electrode and the at least one second module electrode.

The housing may have a box-like body with two opposite sides (i.e. the first side and the second side). The modules may be stacked and electrically interconnected via these sides, wherein a first side of a first module and a second side of a second module face each other. It may be that a conductive plate is arranged between the facing sides.

It may be that the first module electrodes are electrically connected with each other via the second side of a neighboring module and/or via a conductive plate arranged between the module and the neighboring module.

According to an embodiment of the invention, the power semiconductor module further comprises a surge arrester arrangement with a surge arrester accommodated in the housing, such that a first electrode of the surge arrester arrangement is provided at the first side of the housing and a second electrode of the surge arrester arrangement is provided at the second side of the housing.

A surge arrester may be an electronic device and/or may have a voltage dependent resistance, which is decreasing with increasing voltage. The surge arrester may comprise a material, which has a voltage dependent resistance, which is decreasing with increasing voltage. The surge arrester may be a varistor, such as a metal oxide varistor.

The surge arrester may have a plate-like body with two opposite electrodes (i.e. the first and second electrode), between which the material with voltage dependent resistance is provided. The surge arrester may have the shape of a disc.

The surge arrester may be integrated into the housing via the surge arrester arrangement, which besides the surge arrester may comprise one or more electrically conducting plates and/or a spring element. The surge arrester arrangement may be accommodated in an opening in the housing of the power semiconductor module.

The electrodes of the surge arrester arrangement may be arranged such that the surge arrester may be connected in parallel with the power semiconductor chips. The first electrode and/or the first electrode of the surge arrester arrangement may be at the same level as the first and/or the second module electrode. In such a way, the electrodes may be electrically interconnected with a conducting plate provided between neighboring modules.

According to an embodiment of the invention, the plurality of power semiconductor chips are arranged in an annular region in the housing and the surge arrester arrangement is arranged within the annular region. The power semiconductor chips all may be arranged around the surge arrester, in particular, they may be arranged between a minimal and a maximal distance to the surge arrester in a ring around the surge arrester. The surge arrester may be arranged at a center of the power semiconductor module.

An annular region may be a region, which has a minimal diameter and maximal diameter with respect to a center of the power semiconductor module. In such a way, all electrical connections between the surge arrester and the power semiconductor chips may have substantially the same length. When the power semiconductor chips are distributed around the surge arrester, the electrical connections also may be symmetric with respect to the surge arrester. All this may lower the stray inductance of the conductor loop generated between the surge arrester and the semiconductor chips.

Additionally, the arrangement of the semiconductor chips in an annular region around the surge arrester may result in a smaller footprint of the power semiconductor module compared with a module, where the surge arrester is arranged at a side of the power semiconductor chips.

According to an embodiment of the invention, the surge arrester arrangement comprises a spring element arranged between the surge arrester and a module side plate at the second side of the housing. The spring element may be used for pressing the surge arrester with one of its electrodes against a conducting plate and/or a neighboring module, when the power semiconductor module is stacked with other power semiconductor modules.

It has to be noted that the module side plate may be and/or may comprise a conductor, which electrically interconnects the power semiconductor chips and/or surge arrester arrangement.

According to an embodiment of the invention, the surge arrester is electrically connected via the spring element with the module side plate. The spring element may be made of elastic metal material. For example, the spring element may be a disc spring.

According to an embodiment of the invention, the surge arrester arrangement comprises conducting plates arranged between the surge arrester and a module side plate for height compensation between a height of the surge arrester and a height of the power semiconductor module. The surge arrester, the conducting plates (as well as the spring element) may be accommodated in an opening in the housing of the power semiconductor module, which opening substantially protrudes from the first side to the second side of the power semiconductor module. Since the surge arrester together with the spring element may have a lesser height than submodules accommodating the power semiconductor chips, the conducting plates of the surge arrester arrangement may be used for compensating the different heights.

According to an embodiment of the invention, the surge arrester is electrically connected via the conducting plates, which may be metal plates, with the module side plate. As already mentioned, the module side plate may provide an electrical connection from the surge arrester arrangement to the power semiconductor chips.

According to an embodiment of the invention, the surge arrester is electrically connected via the module side plate with the at least one second module electrode. For example, the second module electrode may be provided by an outer side of the module side plate, while the surge arrester arrangement is attached to and/or disposed on an inner side of the module side plate.

According to an embodiment of the invention, the power semiconductor chips are accommodated in submodules, which are arranged in openings of the housing. The openings may protrude from the first side to the second side of the housing, for example to a module side plate at the second side. These openings and/or the submodules may be arranged in the annular region surrounding the surge arrester.

The submodules itself may comprise submodule housings, which accommodate one or more power semiconductor chips. Every submodule may comprise a substrate to which one or more power semiconductor chips are bonded.

According to an embodiment of the invention, the submodules are disposed on a module side plate of the power semiconductor module providing the at least one second power electrode. In such a way, the submodules and the power semiconductor chips may be electrically connected to the module side plate.

According to an embodiment of the invention, each submodule comprises spring elements, which are arranged between the power semiconductor chips and the side plate. The spring elements may press against a side and/or electrode of each power semiconductor chip and at an opposite end at the module side plate, when the power semiconductor module is stacked with other power semiconductor modules.

According to an embodiment of the invention, each submodule provides a first module electrode protruding from the housing. Such module electrodes may be pressed against a conducting plate that may be arranged between neighboring stacked power semiconductor modules.

According to an embodiment of the invention, the power semiconductor module further comprises a (first) conducting plate attached to the first side of the housing, such that the at least one first module electrode and the first electrode of the surge arrester arrangement are electrically connected with each other. The conducting plate may be a metal plate. The conducting plate also may provide an electrical contact to the second side and/or the second module electrode of a neighboring power semiconductor module.

According to an embodiment of the invention, the power semiconductor module further comprises a (second) conducting plate attached to the second side of the housing, such that the at least one second module electrode and the second electrode of the surge arrester arrangement are electrically connected with each other. The second conducting plate may be a conducting plate attached to a first side of a neighboring power semiconductor module and/or may be part of a module side plate.

According to an embodiment of the invention, the first and/or the second conducting plate comprises a channel to be cooled with a cooling fluid to be conducted through the channel. In general, a conducting plate at the first side and/or the second side of the power semiconductor module may be actively cooled. With this, the semiconductor chips and the surge arrester may be cooled.

The possibility of cooling the surge arrester may reduce a time between repetitive pulses due to a faster cool-down of the surge arrester. In case of multiple surges, one after another, the injected energy may be cumulated in the surge arrester and therefore an intermediary cool-down time may be ignored. A higher repetition rate of pulses may become possible. Due to active cooling of the arrester, the power semiconductor module may receive a higher energy capability and no derating dependent on an ambient temperature may be required. This may result in a higher continuous DC voltage capability and/or a smaller cool-down time.

According to an embodiment of the invention, the power semiconductor module further comprises a module gate electrode protruding from the housing between the first side and the second side, which module gate electrode is electrically connected to chip gate electrodes of the power semiconductor chips. The module gate electrode may be connected via conductors in the module side plate with the power semiconductor chips.

When several power semiconductor modules are stacked and thus electrically connected in series, their module gate electrodes may be electrically connected with each other and/or may be supplied with the same gate signal.

A further aspect of the invention relates to a power semiconductor module stack, which comprises at least two power semiconductor modules as described in the above and in the following. Conducting plates may be arranged between the power semiconductor modules.

Such a conducting plate may interconnect the at least one first module electrode of a first power semiconductor module with the at least one second module electrode of a neighboring power semiconductor module.

According to an embodiment of the invention, the power semiconductor module stack comprises a pressing device pressing the power semiconductor modules and the conducting plates together. The spring element of the surge arrester arrangement and the spring element of the submodules may be compressed by the pressing device. In such a way, a reliable electrical connection between the surge arrester and between the module electrodes of the submodules and a neighboring conducting plate can be achieved.

FIG. 1 shows a power semiconductor module stack 10, which is composed of several power semiconductor modules 12. Conducting plates 14, such as metal plates, are arranged between the power semiconductor modules 12, which are electrically interconnecting one or more first module electrodes 18 of one of the modules 12 with one or more second module electrodes 20 of a neighboring module 12. The power semiconductor modules 12 may be electrically connected in series via the conducting plates 14.

A pressing device 22, which is composed of an upper part 24, a lower part 26 and interconnecting members 28 is pressing the power semiconductor modules 12 and the conducting plates 14 together.

It may be that some or all of the conducting plates 14 are actively cooled, for example via a channel 30, in the respective conducting plate 14 through which a cooling fluid 32, such as a liquid or a gas, is pumped.

The power semiconductor modules 12 also may comprise module gate electrodes 34, which are used for controlling power semiconductor chips 36 inside the power semiconductor modules 12 and/or which are electrically connected to gate electrodes of the power semiconductor chips 36. In particular, each power semiconductor module 12 comprises a plurality of power semiconductor chips 36, each of which provides one or more power semiconductor switches, which are electrically connected with a first electrode 37 (such as an emitter electrode) with the first module electrodes 18 and with a second electrode 39 (such as a collector electrode) with the second module electrodes 20. Therefore, the power semiconductor chips 36 and or the switches provided by them are electrically connected in parallel between the first module electrodes 18 and the second module electrodes 20. The parallel connection may be made via a conducting plate 14 and/or via conductors inside the respective power semiconductor module 12.

Every power semiconductor module 12 also comprises a surge arrester 38, which may be arranged substantially in a middle between the power semiconductor chips 36. Also the surge arrester 38 is connected in parallel with the power semiconductor chips 36 between the first module electrodes 18 and the second module electrodes 20.

Figure 2:
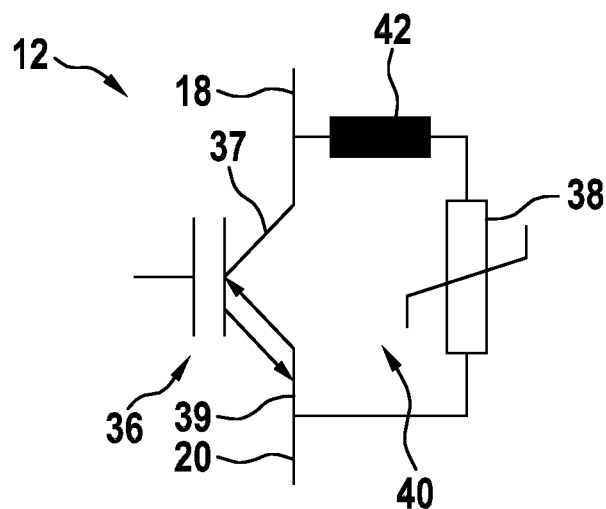
FIG. 2 shows a circuit diagram for a power semiconductor module according to an embodiment of the invention.

FIG. 2 shows a circuit diagram for a power semiconductor module 12 of the stack 10 of FIG. 1. The paralleled semiconductor switches of the semiconductor chip 36 are depicted as an IGBT with integrated diode. However, these switches also may be IGBTs with an external diode, IGCTs, thyristors, MOSFETs, etc. As depicted, the surge arrester 38 may be a varistor, such as a metal oxide varistor.

Due to the parallel connection, a conductor loop 40 is formed, which has a specific stray inductance 42, which is due to the electrical interconnections between the semiconductor chips 36 and the surge arrester 38. When the surge arrester 38 becomes conducting, a circulating current may be generated in the loop 40. This may result in an overshoot voltage caused by the stray inductance 42. Herein, as explained above and below, the power semiconductor modules 12 are designed in a special way that significantly reduces this stray inductance 42.

Figure 3:
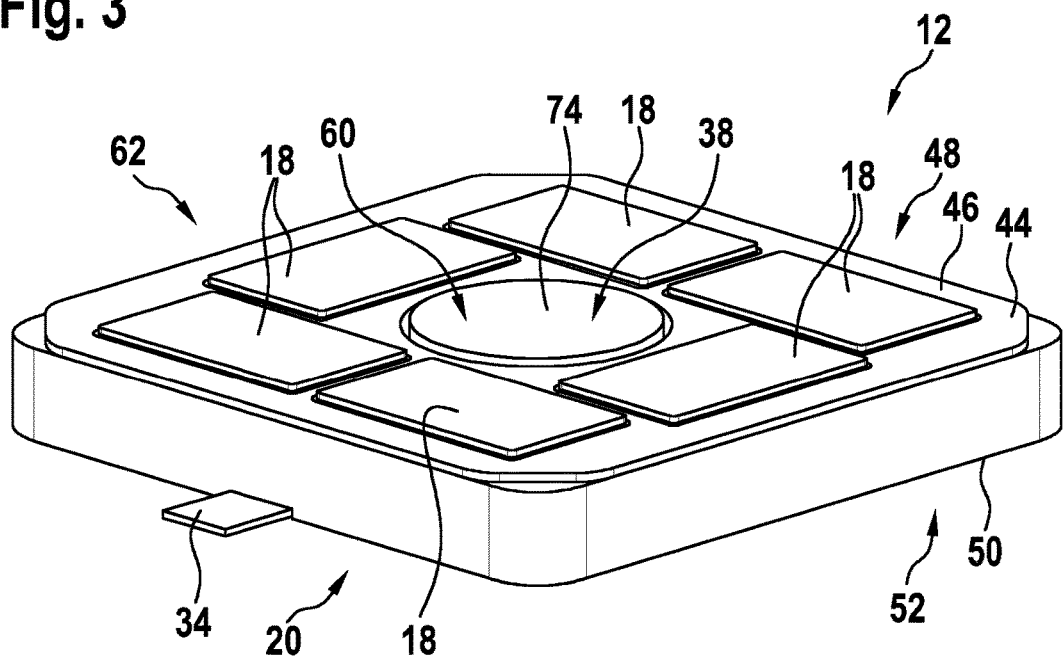
FIG. 3 shows a perspective view of a power semiconductor module according to an embodiment of the invention.
Figure 4:
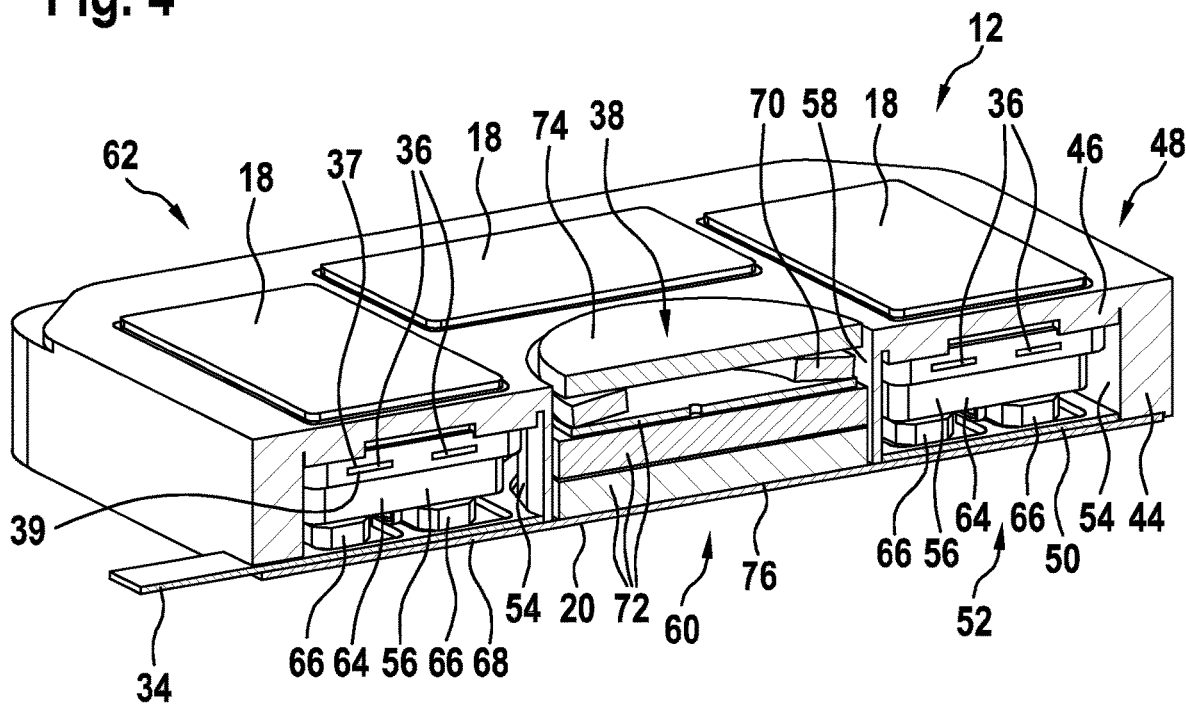
FIG. 4 shows a cross-sectional perspective view of the power semiconductor module of FIG. 3.

FIGS. 3 and 4 shows one of the power semiconductor modules 12 in more detail.

The power semiconductor module 12 comprises a housing 44 that may be made of plastics and that may have a first side plate 46 at a first side 48 and second side plate 50 at a second side 52, which is opposite to the first side 48. The sides 48, 52 and/or the side plates 46, 52 may be aligned parallel.

The housing 44 comprises openings 54, in which submodules 56 are accommodated, which accommodate the power semiconductor chips 36. Furthermore, the housing 44 comprises a central opening 58, in which a surge arrester arrangement 6o is accommodated. The openings 54, 58 are opened to the outside at the first side 48. The openings protrude through the side plate 46 and/or protrude from the first side 48 through the housing 44 to the second side plate 50.

The openings 56 as well as the submodules 56 and the semiconductor chips 36 are arranged in an annular region 62 around the opening 58, the surge arrester arrangement 6o and the surge arrester 38. In such a way, the electrical connections from the power semiconductor chips 36 to the surge arrester 38 may all have substantially the same length and are symmetrically distributed around a center of the power semiconductor module 12. This may lower the stray inductance 42 significantly. Additionally, the surge arrester 38 may be cooled via a conducting plate 14, which also may cool the semiconductor chips 36.

The annular region 62 may be a part of the module 12 and/or housing 44, which is in between a minimal diameter with respect to the center axis of the module 12 and/or housing 44 and a maximal diameter with respect to the center axis.

The semiconductor chips 36 may be arranged all around the surge arrester 38 in the annular region 62. This may mean that there is no angular range bigger than 300 or bigger than 450 around the center axis, where no semiconductor chip 36 is arranged.

Each submodule 56 may itself comprise a housing 64 in which the semiconductor chips 36 are accommodated, for example bonded to a substrate.

At one side, the housing 64 provides a first module electrode 18, which may slightly protrude from the housing 44 of the module 12, when not being compressed into the stack 10.

At an opposite side, electrically conducting spring elements 66 protrude from the housing 64, which are arranged between one of the semiconductor chips 36 and the side plate 50. The spring elements 66 interconnect the semiconductor chips 36 with the side plate 50, which may comprise a conducting and/or metal plate 68 which provides on an outer side the second module electrode 20 and an inner side, on which the spring elements 66 are deposited.

The conducting plate 68 may comprise a cooling channel 30 as described with respect to FIG. 1. It also may be that a conducting plate 14 with a cooling channel 30, for example such as described with respect to FIG. 1, is attached to and/or pressed against the conducting plate 68.

The surge arrester arrangement 60 comprises the surge arrester 38, a spring element 70, and one or more conducting plates 72.

The surge arrester 38 provides a first electrode 74 of the surge arrester arrangement 60 with a first side. At a second side, the surge arrester 38 is in electrical contact with the spring element 70, which may be a disc spring. The surge arrester 38, which may be disc-shaped, and the spring element 70 may have substantially the same diameter.

The spring element 70 is in electric contact with the one or more conducting plates 72, which are used for compensating for the lesser height of the surge arrester 38 together with the spring element 70 compared to the submodules 56.

The last conducting plate 72 provides a second electrode 76 of the surge arrester arrangement, which is in electrical contact with the side plate 50 and/or the metal plate 68. The one or more conducting plates 72 may comprise substantially the same diameter as the surge arrester 38.

The side plate 50 also may comprise conductors, which interconnect the module gate electrode 34 with the corresponding gate electrodes of the power semiconductor chips 36.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practicing the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS 10 power semiconductor module stack
12 power semiconductor module
14 conducting plate
18 first module electrode
20 second module electrode
22 pressing device
24 upper part
26 lower part
28 interconnecting member
30 channel
32 cooling fluid
34 module gate electrode
36 power semiconductor chip
37 first chip electrode
38 surge arrester
39 second chip electrode
40 conductor loop
42 stray inductance
44 housing
46 first side plate
48 first side
50 second side plate
52 second side
54 opening
56 submodule
58 central opening
60 surge arrester arrangement
62 annular region
64 housing
66 spring element
68 metal plate
70 spring element
72 conducting plate
74 first electrode
76 second electrode

The invention claimed is:

1. A power semiconductor module, comprising:
   a plurality of power semiconductor chips, each chip providing power semiconductor switch;
   a housing accommodating the power semiconductor chips, the housing having a top side opposite a bottom side, the top side adjacent a top side of each of the power semiconductor chips and the bottom side adjacent a bottom side of each of the power semiconductor chips, the top side of the housing connected to the bottom side of the housing by housing side walls;
a first module electrode on the top side of the housing electrically connected to a first chip electrode of the power semiconductor chips;
a second module electrode on the bottom side of the housing electrically connected to a second chip electrode of the power semiconductor chips;
a surge arrester arrangement with a surge arrester accommodated in the housing, such that a first electrode of the surge arrester arrangement is provided at the top side of the housing and a second electrode of the surge arrester arrangement is provided at the bottom side of the housing;
a conducting plate attached to the bottom side of the housing, such that the second module electrode and the second electrode of the surge arrester arrangement are electrically connected with each other; and
wherein the plurality of power semiconductor chips are arranged in an annular region in the housing and the surge arrester arrangement is arranged within the annular region.

2. The power semiconductor module of claim 1, wherein the surge arrester arrangement comprises a spring element arranged between the surge arrester and a module side plate at the bottom side of the housing.

3. The power semiconductor module of claim 2, wherein the surge arrester is electrically connected to the module side plate via the spring element.

4. The power semiconductor module of claim 2, wherein the spring element is a disc spring.

5. The power semiconductor module of claim 1,
wherein the power semiconductor chips are accommodated in submodules, which are arranged in one or more openings of the housing; and
wherein the submodules are arranged in the annular region.

6. The power semiconductor module of claim 5, wherein the submodules are disposed on a module side plate of the power semiconductor module providing the a second power electrode.

7. The power semiconductor module of claim 6, wherein each submodule comprises spring elements, which are arranged between the power semiconductor chips and the module side plate.

8. The power semiconductor module of claim 5, wherein each submodule provides a first module electrode protruding from the housing.

9. The power semiconductor module of claim 1, wherein the conducting plate comprises a channel to be cooled with a cooling fluid to be conducted through the channel.

10. A power semiconductor module, comprising:
a plurality of power semiconductor chips, each chip providing a power semiconductor switch;
a housing for accommodating the power semiconductor chips;
a first module electrode on a first side of the housing electrically connected to a first chip electrode of the power semiconductor chips;
a second module electrode on a second side of the housing electrically connected to a second chip electrode of the power semiconductor chips, the second side of the housing being opposite to the first side;
a surge arrester arrangement with a surge arrester accommodated in the housing, such that a first electrode of the surge arrester arrangement is provided at the first side of the housing and a second electrode of the surge arrester arrangement is provided at the second side of the housing; and
a conducting plate attached to the second side of the housing, such that the second module electrode and the second electrode of the surge arrester arrangement are electrically connected with each other;
wherein the plurality of power semiconductor chips are arranged in an annular region in the housing and the surge arrester arrangement is arranged within the annular region;
wherein the surge arrester arrangement comprises one or more conducting plates arranged between the surge arrester and a module side plate for height compensation between a height of the surge arrester and a height of the power semiconductor module; and
wherein the surge arrester is electrically connected via the one or more conducting plates with the module side plate.

11. The power semiconductor module of claim 10, wherein the surge arrester is electrically connected to the second module electrode via the module side plate.

12. A power semiconductor module, comprising:
a plurality of power semiconductor chips, each chip providing a power semiconductor switch;
a housing for accommodating the power semiconductor chips;
a first module electrode on a first side of the housing electrically connected to a first chip electrode of the power semiconductor chips;
a second module electrode on a second side of the housing electrically connected to a second chip electrode of the power semiconductor chips, the second side of the housing being opposite to the first side;
a surge arrester arrangement with a surge arrester accommodated in the housing, such that a first electrode of the surge arrester arrangement is provided at the first side of the housing and a second electrode of the surge arrester arrangement is provided at the second side of the housing, wherein the plurality of power semiconductor chips are arranged in an annular region in the housing and the surge arrester arrangement is arranged within the annular region;
a first conducting plate attached to the first side of the housing, such that the first module electrode and the first electrode of the surge arrester arrangement are electrically connected with each other; and
a second conducting plate attached to the second side of the housing, such that the second module electrode and the second electrode of the surge arrester arrangement are electrically connected with each other.

13. The power semiconductor module of claim 12, wherein the surge arrester arrangement comprises a spring element arranged between the surge arrester and a module side plate at the second side of the housing.

14. The power semiconductor module of claim 12,
wherein the power semiconductor chips are accommodated in submodules, which are arranged in one or more openings of the housing; and
wherein the submodules are arranged in the annular region.

15. The power semiconductor module of claim 12, wherein each of the first conducting plate and the second conducting plate comprises a channel to be cooled with a cooling fluid to be conducted through the channel.

16. A power semiconductor module, comprising:
a plurality of power semiconductor chips, each chip providing a power semiconductor switch;
a housing for accommodating the power semiconductor chips;
a first module electrode on a first side of the housing electrically connected to a first chip electrode of the power semiconductor chips;
a second module electrode on a second side of the housing electrically connected to a second chip electrode of the power semiconductor chips, the second side of the housing being opposite to the first side;
a surge arrester arrangement with a surge arrester accommodated in the housing, such that a first electrode of the surge arrester arrangement is provided at the first side of the housing and a second electrode of the surge arrester arrangement is provided at the second side of the housing, wherein the plurality of power semiconductor chips are arranged in an annular region in the housing and the surge arrester arrangement is arranged within the annular region;
a conducting plate attached to the second side of the housing, such that the second module electrode and the second electrode of the surge arrester arrangement are electrically connected with each other; and
a module gate electrode protruding from the housing between the first side and the second side, which module gate electrode is electrically connected to chip gate electrodes of the power semiconductor chips.

17. The power semiconductor module of claim 16, wherein the surge arrester arrangement comprises a spring element arranged between the surge arrester and a module side plate at the second side of the housing.

18. The power semiconductor module of claim 16,
wherein the power semiconductor chips are accommodated in submodules, which are arranged in one or more openings of the housing; and
wherein the submodules are arranged in the annular region.

19. The power semiconductor module of claim 16, wherein the conducting plate comprises a channel to be cooled with a cooling fluid to be conducted through the channel.

20. A power semiconductor module stack, comprising:
a plurality of power semiconductor modules;
conducting plates arranged between the power semiconductor modules; and
a pressing device pressing the power semiconductor modules and the conducting plates together;
wherein each of the power semiconductor modules comprises:
a plurality of power semiconductor chips, each chip providing a power semiconductor switch;
a housing for accommodating the power semiconductor chips;
a first module electrode on a first side of the housing electrically connected to a first chip electrode of the power semiconductor chips;
a second module electrode on a second side of the housing electrically connected to a second chip electrode of the power semiconductor chips, the second side of the housing being opposite to the first side;
a surge arrester arrangement with a surge arrester accommodated in the housing, such that a first electrode of the surge arrester arrangement is provided at the first side of the housing and a second electrode of the surge arrester arrangement is provided at the second side of the housing;
a conducting plate attached to the second side of the housing, such that the second module electrode and the second electrode of the surge arrester arrangement are electrically connected with each other; and
wherein the plurality of power semiconductor chips are arranged in an annular region in the housing and the surge arrester arrangement is arranged within the annular region.

\* \* \* \* \*